United States Patent [19]

Tanielian

[11] Patent Number: 5,510,655
[45] Date of Patent: Apr. 23, 1996

[54] SILICON WAFERS CONTAINING CONDUCTIVE FEEDTHROUGHS

[75] Inventor: Minas H. Tanielian, Bellevue, Wash.

[73] Assignee: The Boeing Company, Seattle, Wash.

[21] Appl. No.: 325,548

[22] Filed: Oct. 18, 1994

Related U.S. Application Data

[60] Continuation of Ser. No. 979,297, Nov. 20, 1992, abandoned, which is a division of Ser. No. 618,056, Nov. 26, 1990, Pat. No. 5,166,097.

[51] Int. Cl.$^6$ .................................................. H01L 29/40
[52] U.S. Cl. ....................... 257/774; 257/698; 257/700; 257/739; 257/773; 257/714; 257/621
[58] Field of Search .................................... 257/757, 698, 257/700, 773, 774, 739, 621, 714

[56] References Cited

U.S. PATENT DOCUMENTS

| | | | |
|---|---|---|---|
| 3,462,650 | 8/1969 | Hennings et al. | 257/621 |
| 3,577,037 | 5/1971 | DiPietro | 257/777 |
| 3,986,196 | 10/1976 | Decker et al. | 357/22 |
| 4,275,410 | 6/1981 | Grinberg et al. | 357/68 |
| 4,374,457 | 2/1983 | Wiech, Jr. | 29/591 |
| 4,499,655 | 2/1985 | Anthony | 29/576 |
| 4,617,730 | 10/1986 | Geldermans | 29/843 |
| 4,695,872 | 9/1987 | Chatterjee | 357/75 |
| 4,725,562 | 2/1988 | El-Kareh et al. | 437/67 |
| 4,737,470 | 4/1988 | Bean | 437/38 |
| 4,765,864 | 8/1988 | Holland et al. | 156/644 |
| 4,849,374 | 7/1989 | Chen et al. | 437/209 |
| 4,954,458 | 9/1990 | Reid | 437/51 |
| 5,039,628 | 8/1991 | Carey | 437/183 |

OTHER PUBLICATIONS

Wu, "Wafer Structure Permitting Distribution from the Back Side of the Wafer", IBM Technical Disclosure, vol. 16, No. 9 Feb. 1974, pp. 2898–2899.

Primary Examiner—Robert P. Limanek
Assistant Examiner—Valencia Martin Wallace
Attorney, Agent, or Firm—Christensen, O'Connor, Johnson & Kindness

[57] ABSTRACT

Silicon wafers containing conductive feedthroughs of an hourglass shape located around their peripheries that can be incorporated into multichip modules that includes silicon wafer spacers having radial grooves for receiving cooling fluid.

10 Claims, 7 Drawing Sheets

5,510,655

SILICON WAFERS CONTAINING CONDUCTIVE FEEDTHROUGHS

This application is a continuation application based on prior application Ser. No. 07/979,297, filed on Nov. 20, 1992, now abandoned, which in turn is a divisional application of application Ser. No. 07/618,056, filed Nov. 26, 1990, now U.S. Pat. No. 5,166,097, the benefit of the filing dates of which are claimed under 35 U.S.C. § 120.

FIELD OF THE INVENTION

This invention relates to methods for forming feedthroughs for electrical and/or thermal conduction between the front and back of a silicon wafer, silicon wafers containing such feedthroughs, and integrated circuit packaging based on these silicon wafers.

BACKGROUND OF THE INVENTION

The current trend in integrated circuit packaging is to use automated forms of lead bonding such as tape automated bonding (TAB) and flip-chip techniques as opposed to the more traditional methods of wire-bonding because of improved reliability, higher yield and improved performance due to the reduced lead inductance, especially for fast chips with large numbers of input/outputs (I/Os).

As future needs for more compact and lightweight packaging become critical for many applications, the present method of single-chip packaging will be replaced by some type of multichip packaging. Of the multichip packaging approaches, the most commonplace is one that uses copper as the conductive metal, polyimide as the dielectric and silicon wafers as substrates, sometimes being referred to as silicon-on-silicon hybrid wafer scale integration. Such a multichip package can either be put into a hybrid ceramic package or mounted directly on some form of mother board. In either case, a problem arises when the number of inputs/outputs (I/Os) of the multichip module is very large (more than a few hundred).

The present invention encompasses ways of facilitating and improving the bonding of a large number of I/Os in a multichip module. The methods of the present invention involve creating feedthroughs in a silicon substrate (e.g., a silicon wafer) using an etching method, as described in greater detail herein.

The following patents involve related technology:

Chatterjee et al. in U.S. Pat. No. 4,695,872, describes a form of multichip packaging. The substrate used in this patent is silicon and its basic form has a processor chip on one side of the substrate with a number of memory chips on the other side. To interconnect the processor chip with the memory chips on the other side of the substrate, Chatterjee et al. creates conduits, i.e., feedthroughs, in the substrate. In contrast to the present methods, the feedthroughs in Chatterjee et al. were created with a laser. Moreover, the subsequent steps disclosed in Chatterjee et al. are different in a number of respects from the steps in the present methods.

Anthony, U.S. Pat. No. 4,499,655, is directed to a method that is somewhat similar to the present invention in its usage, but the method of forming the feedthroughs in the substrate is different: hole drilling is used in Anthony. This method cannot be used for small geometries. In this prior patent also, silicon is not a substrate of primary interest; rather, sapphire is utilized. Anthony also does not mention an insulating/coating layer inside the feedthroughs, as in the present invention, since Anthony assumes an insulating substrate body.

El-Kareh et al., in U.S. Pat. No. 4,725,562, describes a way of making contact to a device that has trench isolation. This is basically an "IC processing"-type patent relating to the performance of individual transistors in an IC and it does not relate significantly to the method, technique or functionality of the present invention.

From the above, it will be apparent that a need continues to exist for methods that will provide a connector for packaging that can accommodate large numbers of I/O leads. Moreover, there remains a need for methods of forming feedthroughs in silicon wafers that are reliable and reproducible.

SUMMARY OF THE INVENTION

In accordance with the present invention, a technique is described for forming conductive feedthroughs in a silicon wafer, such that a bonding site on the front of the wafer also has a corresponding bonding site or pad on the backside. These feedthroughs are isolated from each other and from the silicon wafer by a dielectric layer. The present technique allows one to use the backside of the silicon wafer to form bonds for electrical connection.

The methods of the present invention involve the steps of providing an oxidized silicon wafer that has been patterned in a desired manner, preferably on opposing sides of the wafer. The patterns on the opposing sides of the wafer are substantially the same so that when they are exposed to the etchant conditions, etching occurs from both sides of the wafer towards the center of the wafer until a feedthrough is created. In other words, in a preferred embodiment, etching proceeds from both sides of the silicon wafer and is allowed to continue to produce a feedthrough. After creating the feedthroughs in the patterned wafer, they are electrically isolated by a dielectric layer, they are then metallized, and then optionally, are filled with a metal paste that is subsequently converted into its metallic form. The feedthroughs may be connected to multichip module bonding pads on the periphery of the silicon wafer. The silicon wafers containing feedthroughs may be used as spacers for stacking multichip modules so as to form a 3-D integrated circuit.

The present invention encompasses methods of forming the feedthroughs, silicon wafers containing feedthroughs, multichip modules including wafers containing feedthroughs, and integrated circuits made up of stacks of multichip modules containing feedthroughs.

DETAILED DESCRIPTION OF THE PREFERRED EMBODIMENTS

In accordance with the present invention, methods are provided that enable formation of a large number of feedthroughs (also referred to in the art as vias) in a small area of a silicon wafer with corresponding pads on both sides of the silicon wafer.

Conventionally, there has been no connector or available packaging that can accommodate, for example, 500 to 1,000 I/O leads for a 3×3 inch multichip module, which is the order of I/Os needed in a high-performance multichip module. The approach described herein is suitable for such an application because it can provide 1000 or more feedthroughs in the periphery of a 3×3 inch multichip module. This density of feedthroughs, which is critical for very demanding applications and high-performance systems, has not been addressed in the past.

To achieve the above-described goal, the technique of forming the feedthroughs (especially the etching procedure) has to be reliable and reproducible and the processing and properties of the resulting feedthroughs have to be compatible with the presently accepted multichip module fabrication approaches in order to be of practical significance.

The importance of having such feedthroughs in multichip packaging applications can be easily envisioned. For instance, such feedthroughs can be used to stack a number of multichip modules vertically in a 3-D integration scheme. Also, they could be used to mount the multichip module on a ceramic module or a printed wiring board. In addition, this technique can be used to form thermal feedthroughs through the substrate (silicon) for improved thermal conductance and reliability. The feedthroughs can be extended through the multichip module itself (e.g., copper/polyimide signal layers) to provide a thermal path between the ICs of the multichip module and the heat sink at the multichip module backside. The advantage of this technology is that the feedthroughs can be formed in advance, prior to the multichip module fabrication, so that their manufacturing yield will not impact the multichip module process yield.

There are three main stages in the formation of the feedthroughs: (1) the etching of the feedthroughs, (2) the dielectric isolation of the feedthroughs and (3) the metallization of the feedthroughs using a conductive metal.

The first stage involves etching the feedthroughs in the substrate. The substrate is silicon in the form of a single crystal silicon wafer. To carry out the etching step to form feedthroughs, the silicon wafer must be patterned. The patterning of the silicon wafer may be carried out using standard methods: for example, the silicon wafer may be oxidized on its surface, photolithographically patterned, and coated with an etch mask.

Figure 1A:
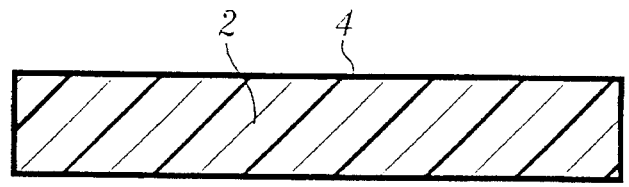
FIG. 1 is a schematic representation of the steps involved in preparing the feedthroughs in accordance with the present invention. Panel A is a schematic representation of an oxidized silicon wafer; in Panel B, the silicon dioxide has been etched off from the areas where the feedthroughs will be located and an etch mask has been created; in Panel C, the wafer has been immersed in a wet etchant to produce V-grooves that meet in the middle of the wafer; in Panel D, a dielectric layer has been added to the exterior surface of the wafer, particularly in the V-grooves; in Panel E, the V-grooves have been metallized; in Panel F, the feedthrough holes have been screened using a conductive metal paste and the paste has been converted into its metallic form.

FIG. 1A is a schematic representation of a silicon wafer (2) that has been oxidized to form a thin layer (4) of oxidized silicon on the surface thereof.

Figure 1B:
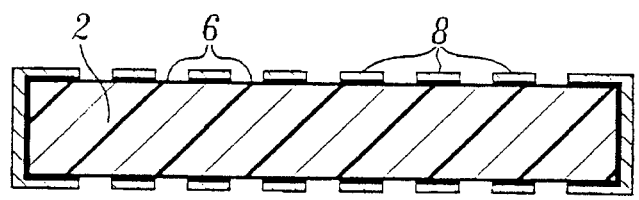

FIG. 1B shows pattern formation (6) on the surface of the oxidized silicon wafer (2) and a thin film (8) of an etch mask material, such as chromium.

The preferred etch mask is a double layer of $SiO_2$ and chromium metal. The etch mask material is preferably deposited by a vacuum deposition method. Both the etch mask material and silicon dioxide are etched off from the areas where the feedthroughs will be located. When a wet etching technique is used, this procedure is carried out on both sides of the wafer; therefore, double-polished wafers are generally used and the lithography, for front to back alignment is done using an infrared aligner.

The next step in formation of the feedthrough is an etching step wherein the silicon wafer substrate is exposed to an etchant. There are two generic ways that one can chemically etch a substrate, in this case a silicon wafer, either dry or wet. In either way, the etching action could be either isotropic or anisotropic. Isotropic etching has no directional preference, i.e., etching proceeds at the same rate on all exposed surfaces. On the other hand anisotropic etching has a definite directional preference so that the depth d of an etched pattern can be much larger than its width w. Anisotropic etching methods are used in the present invention.

One specific type of anisotropic dry etching process, which is useful for the purposes herein, is reactive ion etching. Reactive ion etching or milling can produce ratios of d>>w. This is possible because by-products of the etching process tend to coat the sidewalls of an etched trench thus impeding further sidewise erosion in the trench unless direct ion bombardment takes place (as it does at the bottom of the trench). In contrast to laser etching, which is an isotropic physical etching method, reactive ion etching is advantageous because it allows superior control and an ability to achieve a high aspect ratio.

Anisotropic dry etching in silicon is done using freon-type gases, either containing hydrogen and fluorine or chlorine and chlorine-hydrogen based chemistries. Although reactive ion etching and reactive ion milling techniques can provide excellent anisotropic etching and control, they are not presently suitable for etching thicknesses beyond tens of micrometers (a typical feedthrough will be of the order of hundreds of micrometers). This is purely an equipment issue, however, since most such dry etching systems are targeted at the semiconductor industry where typically etched depths are in the range of a few micrometers. See, *Thin Film Processes*, Ed. by J. Vossen and W. Kern, Academic Press, N.Y., 1978. Deeper etching is difficult to obtain using existing technology.

Figure 1C:
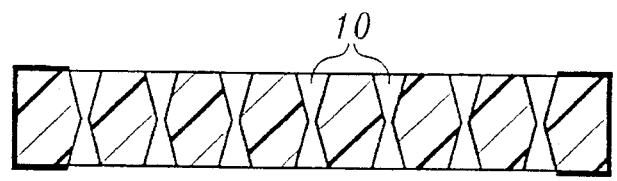

In addition to reactive ion etching, the present invention may also be practiced through the use of wet etching techniques. In contrast to other types of etching techniques, wet etching is generally easier, more amenable to manufacturing processes, and suitable for batch processing for long times. As a general matter, wet etching can suffer from the drawback that it tends to be isotropic; however, a variant called orientation-dependent etching (ODE), which is not isotropic can be used advantageously for the purposes of the present invention since we are using single crystal silicon wafers in the (100) direction. ODE can be used to etch silicon wafers to form very high aspect ratio structures in some cases (i.e., height:width, 400:1 or more.) See, Don L. Kendall, "On etching very narrow grooves in silicon" Applied Physics Letters, 26 (4), 195–198 (Feb. 15, 1975). A preferred embodiment of this invention uses a method that involves the formation of feedthroughs in a silicon substrate using anisotropic wet chemical techniques to produce feedthroughs having a V-groove configuration. In FIG. 1C, a wet etchant material has removed the silicon substrate from opposite sides of the wafer to result in feedthroughs (10) having V-groove profiles.

Examples of anisotropic chemical etch solutions applicable to single crystal silicon may be found in the following publications: R. M. Finne and D. L. Klein, "A Water-Amine Complexing Agent for Etching Silicon," J. Electrochem. Soc., Solid State Science 114, 965 (1967); D. B. Lee, "Anisotropic Etching of Silicon," J. Applied Phys. 40, 4569 (1969); M. J. Declercq, L. Gerzberg, and J. D. Meindl, "Optimization of Hydrazine-Water Solution for Anisotropic Etching of Silicon in Integrated Circuit Technology," J. Electrochem. Soc., Solid State Science 122, 545 (1975); and K. E. Bean, "Anisotropic Etching of Silicon," IEEE Trans. Electron Devices ED-25, 1185 (1978). Any of these techniques, and others, may be used for the purposes described herein.

The preferred ODE etchant is aqueous KOH (e.g., 50% by weight), which is used at elevated temperatures (e.g., 85° C.). Other alkali metal hydroxides (e.g., NaOH) might also be used. The silicon etch rate under these conditions is roughly 0.7 μm/min, so it takes several hours to etch through a silicon wafer. Other etchants that can be used include (1) ethylenediamine, pyrocatechol, deionized water, and (2) hydrazine-deionized water.

When orientation-dependent etching is utilized, etching is preferably carried out on both sides of the silicon wafer substrate by exposure to the etchant. When the etching step disclosed herein involves etching from two opposing sides of the silicon wafer, these sides should be patterned similarly so as to expose opposing etchable portions of the silicon wafer. Each opposing side could be exposed separately to the etchant; however, simultaneous exposure is easier and faster, and therefore preferred. Etching proceeds from both sides of the wafer and the feedthrough is formed when the etchant meets in the interior of the wafer. Reactive ion etching cannot be carried out from both sides of the wafer, so when this technique is utilized, only a single side of the silicon wafer will be exposed to the etchant.

The shape of the mask used to form the feedthrough is preferably a square. In this case the etch pit is trapezoidal in shape with a square base when viewed either from the top or bottom direction and hourglass shaped when viewed in cross section. The etched sidewalls are very smooth and they have a slope of around 54.7° which is determined by the crystal planes (100) and (111). In order to get the minimum feature size, one side of the square has to be parallel to the flat of a silicon wafer which is cut perpendicular to the crystal (100) direction. If the square is misaligned, i.e., it is not parallel to the flat of the wafer, this will result in an enlargement of the etched feedthrough. Although this configuration does not produce a high aspect ratio hole, it has the advantage that the alignment is not very critical and thus it is much more manufacturable.

A second approach, which uses a highly anisotropic etch, is done using the same etchant and alignment procedure but using wafers cut perpendicular to the (110) crystal orientation. In this case, if the length of the etched rectangular pattern is at least as long as the thickness of the silicon wafer, when etching from both sides, one can form holes that have a width of about 100 μm and a length that is roughly of the order of the thickness of the silicon wafer. The ensuing feedthroughs are also trapezoidal when viewed from above or below but they have a rectangular base. In this technique the alignment accuracy is much more critical and any misalignment will increase the width of the hole and produce faceting along the sidewalls. In other words the process control is more difficult.

Figure 1D:
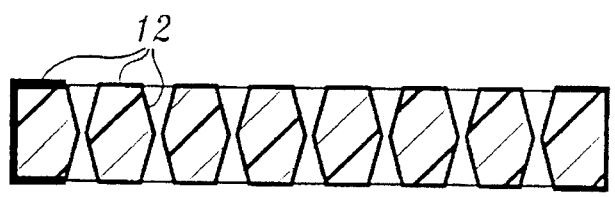

The second stage in the formation of the feedthroughs is the dielectric isolation of the feedthrough holes from each other. This is necessary since any accidental doping in the silicon will make it conductive and thus produce some current leakage between feedthroughs. Referring to FIG. 1D, the interiors of the etched feedthroughs are electrically isolated by a dielectric layer (12). Although silicon is a fairly good insulator when undoped, it is possible to get leakage between the feedthroughs, especially at high frequencies. At very high frequencies it may actually be necessary to make these feedthrough vias in the form of transmission lines with controlled impedance in order to avoid losses and reflections. Thus, in addition to the standard need for good dielectric isolation, the option of having a metal/insulator/metal structure may be desirable. Either of these options can be accommodated with the present etch structure. As far as the dielectric is concerned, to form the first layer, the silicon wafers can be oxidized using standard silicon oxidation techniques. After the metal layer is deposited, the subsequent dielectric layers, for instance silicon dioxide, silicon nitride, aluminum nitrides, tantalum pentoxide, etc., can be deposited using such techniques as Chemical Vapor Deposition (CVD), Plasma Enhanced CVD (PECVD), Low Pressure CVD (LPCVD), RF sputtering and other common techniques of semiconductor processing.

Figure 1E:
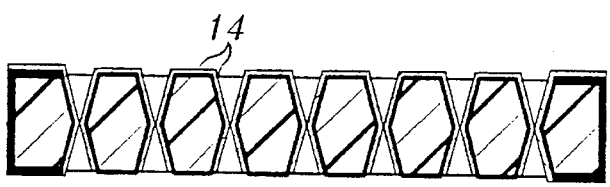

In the third stage in the formation of the feedthroughs, the feedthroughs are metallized to result in a low resistance electrical interconnection between the front and back of the wafer. Exemplifying this step, in FIG. 1E, the V-grooves are coated with a metal layer (14). An example of the metallizing step is given below.

First, the backside of the wafer is metallized using a sputtered chromium/gold/titanium metallization. Using standard photolithographic techniques the backside metallization is patterned such that only the feedthroughs retain the chromium/gold/titanium layer. Then the front surface is metallized using chromium/gold metallurgy. Using standard photolithographic techniques, the gold layer is etched away from the front of the wafer except in the feedthrough area leaving the chromium layer in contact with the feedthroughs and extending all the way to the periphery. Now, the titanium layer on the backside is removed by wet or dry etching and photoresist is patterned on the front side of the wafer, with the same polarity used to pattern the feedthroughs, so that there is photoresist everywhere except in the feedthroughs.

Referring again to FIG. 1E, the feedthroughs are electroplated to the desired thickness with a conductive metal (14)

Figure 1F:
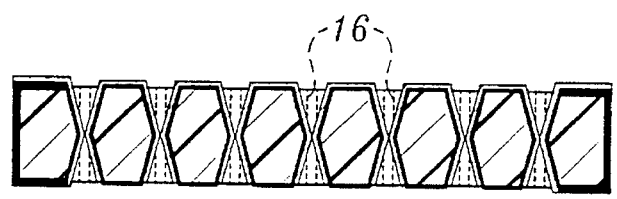

(preferably copper), typically several tens of micrometers, using standard electroplating techniques (e.g., 10 to 30 μm). This step is preferably followed by a second plating step (e.g., with gold) that seals and protects the first plated layer. (If a transmission line is to be made in the feedthrough region, the metal deposition has to be followed by a dielectric deposition, followed by a metal deposition). After this step, the photoresist is removed and the chromium layer etched out to isolate the feedthroughs electrically. Additionally, the feedthroughs can be filled with a conductive paste (such as one used in hybrid circuits) using standard screening techniques, and fired. (See FIG. 1F, wherein a gold metal filling (16) is shown in the feedthroughs.)

Figure 2B:
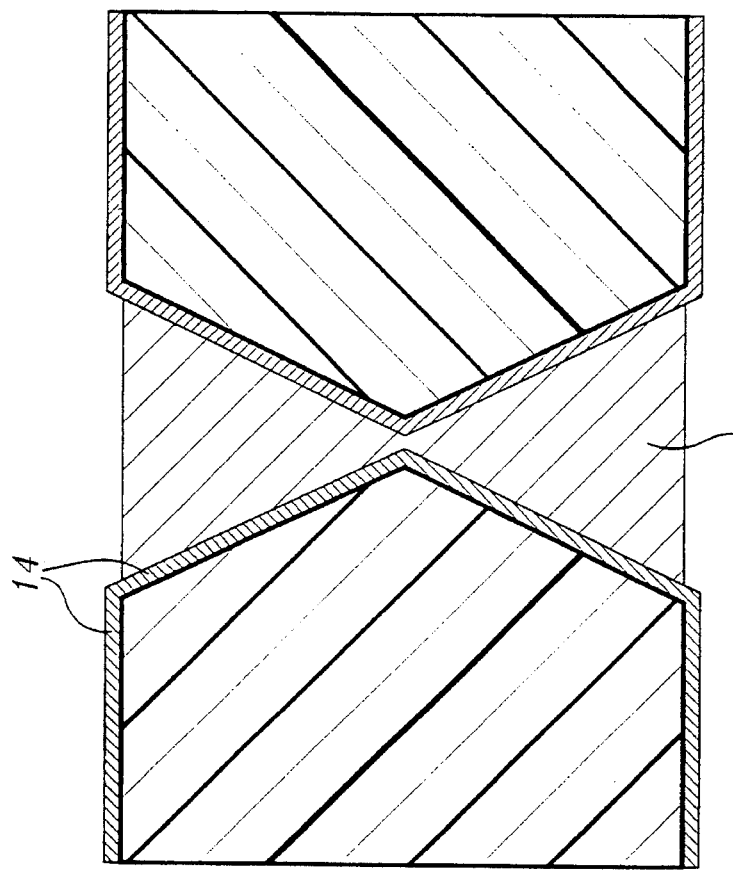
FIG. 2 shows a top view (A) and a side view (B) of an individual feedthrough.
Figure 2A:
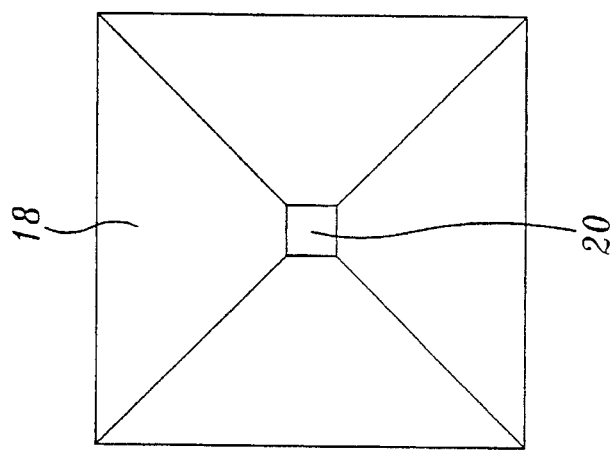

Referring to FIG. 2, a top (A) and side (B) view of a feedthrough prepared by the method described above is shown. In the top view, the side walls (18) and central opening (20) of a feedthrough are depicted. The central opening (20) connects the two sides of the feedthrough so that the silicon wafer is pierced at this location. The central opening (20) is depicted as roughly square in shape, but may under some etching conditions (or using a different pattern) have a different shape (e.g., rounded or rectangular).

FIG. 2(B) depicts a side view of a feedthrough. Metal layer (14) is depicted as establishing electrical connection between the upper face of the wafer, the side walls of the feedthrough, and the lower face of the wafer. In some embodiments, two silicon wafers containing feedthroughs may be used face-to-face with their respective feedthroughs aligned. Under these circumstances, the metal layer on the contacting faces of each of the silicon wafers is optional as long as electrical contact is maintained. FIG. 2(B) also shows the optional, but preferred, conductive metal filler (16) described in connection with FIG. 1F above.

Figure 3:
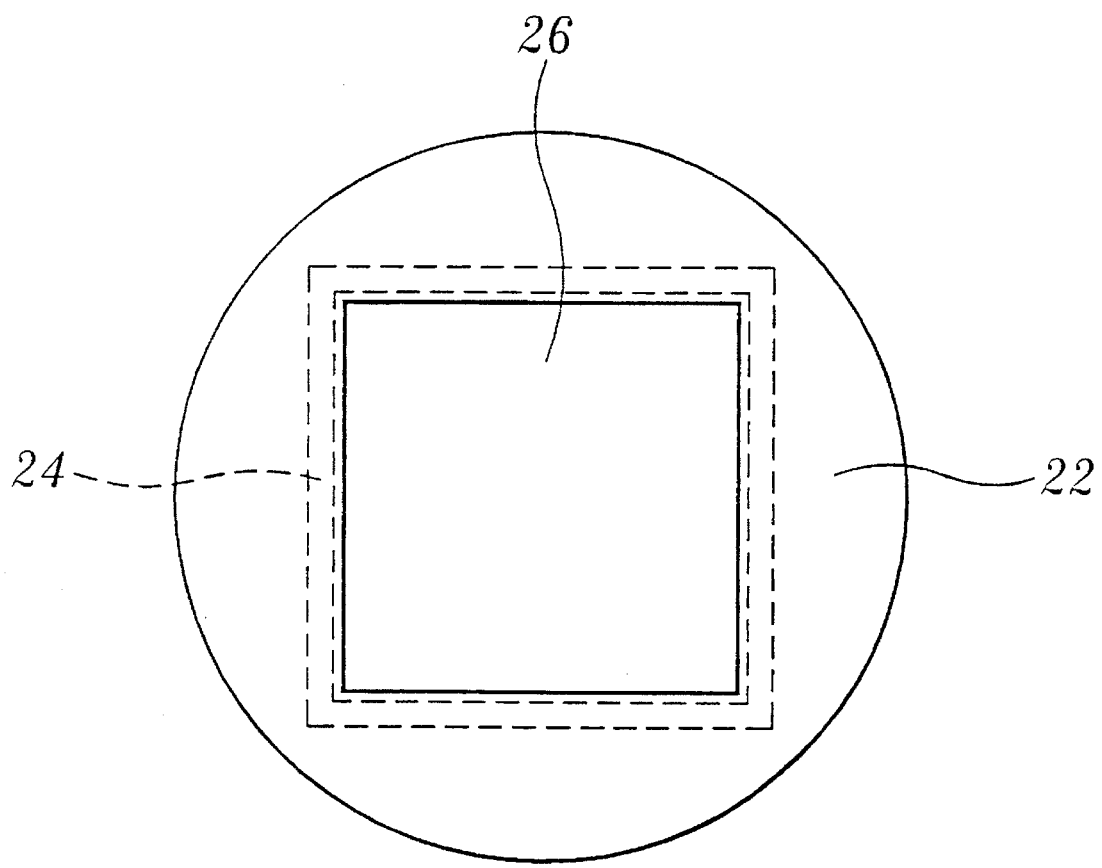
FIG. 3 is a schematic depiction of a multichip module fabricated on a silicon wafer surrounded by a region on the silicon wafer in the periphery of the multichip module containing feedthroughs.

In a preferred use of the silicon wafers containing feedthroughs prepared as described above, a multichip module active area is formed in the central portion of the silicon wafer, which is preferably surrounded by an area of the silicon wafer that contains the feedthroughs. FIG. 3 depicts this type of arrangement. The silicon wafer (22) has feedthroughs formed therein in the region (24), which is defined schematically by the dotted lines. The multichip module active area (26) is the location of the circuitry associated with the wafer. Preferably, this area is an oxidized silicon surface that has been coated with patterns of appropriate materials, such as polyimide dielectric and conductive metal (e.g., copper) lines. The silicon wafer having a central active area may then be stacked on additional similar silicon wafers to produce a stacked multichip module. The feedthroughs in region (24) of each of the silicon wafers provide access from one side of the silicon wafer to the other for electrical interconnections between the active areas. Optionally, the central multichip module area with its associated feedthroughs in the region between the dotted lines can be cut (e.g., sawed) out of the silicon wafer, i.e., the region outside of the outermost dotted line is removed, so that the active area can be put in a hermetically sealed container for high reliability applications.

Figure 4:
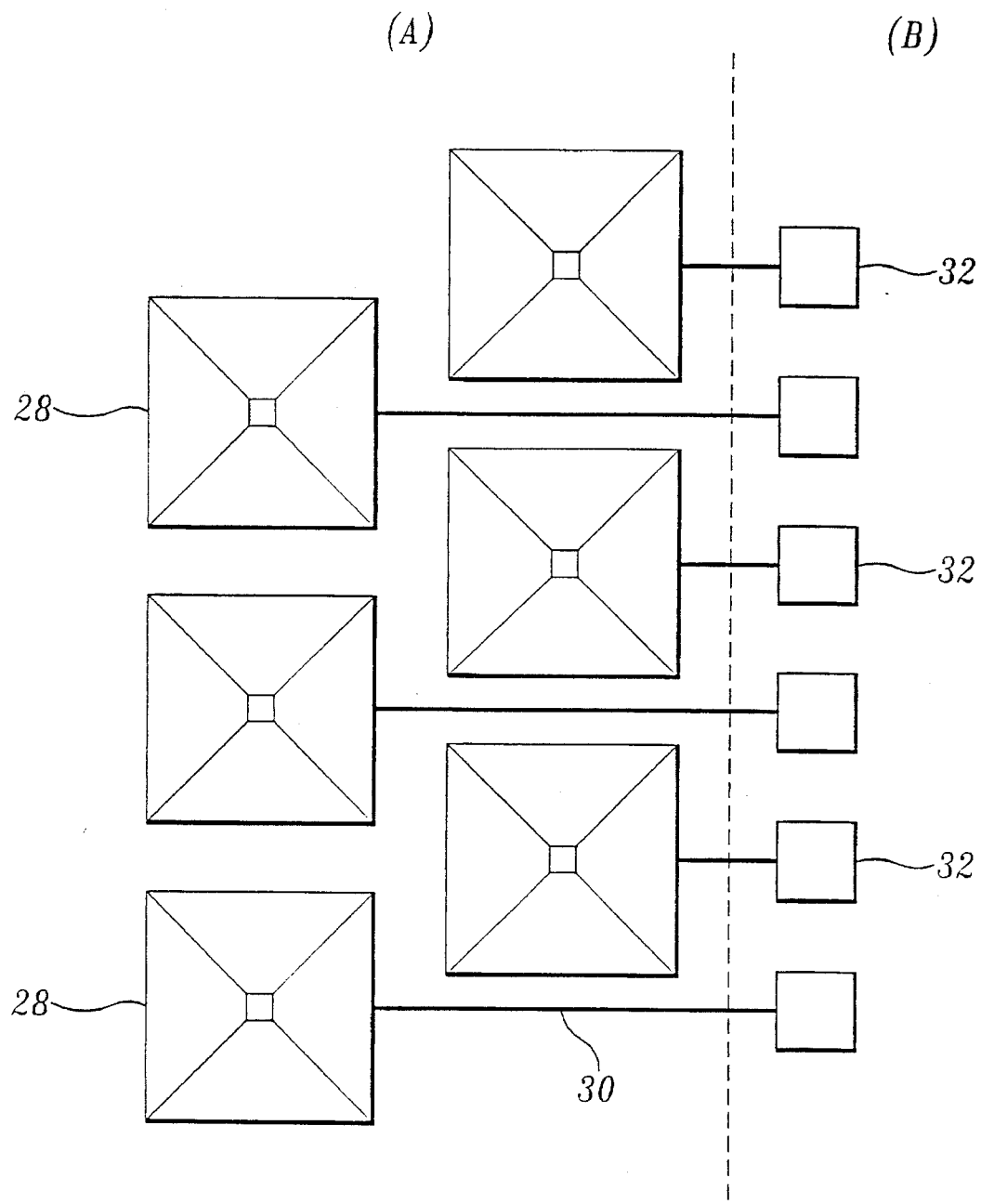
FIG. 4 is a schematic drawing of a section of the multichip module periphery drawn approximately to their relative scale, in which side (A) represents the feedthroughs and side (B) represents the multichip module active area. The smaller squares shown in the multichip module active area (side B) are the multichip module bonding pads.

FIG. 4 depicts a preferred manner of locating the feedthroughs in a silicon wafer, which is being used as the substrate of a multichip module shown in FIG. 3, to connect one active area of a multichip module to another active area on a separate multichip module. Each of feedthroughs (28) [located in the region (24) shown in FIG. 3] is connected through a conductive line (30) to a multichip module bonding pad (32) located in the multichip module active area of the silicon wafer [shown as (26) in FIG. 3].

There are several different ways one can use the feedthroughs to interconnect two separate multichip modules, both electrically and mechanically. One embodiment involves the use of solder bumps which are plated at the multichip module feedthrough locations. These modules are then brought together, the feedthrough locations are aligned, and the solder bumps are fused together by the application of temperature and pressure. Another embodiment involves the use of a conductive adhesive at the feedthrough locations instead of solder bumps.

Figure 5B:
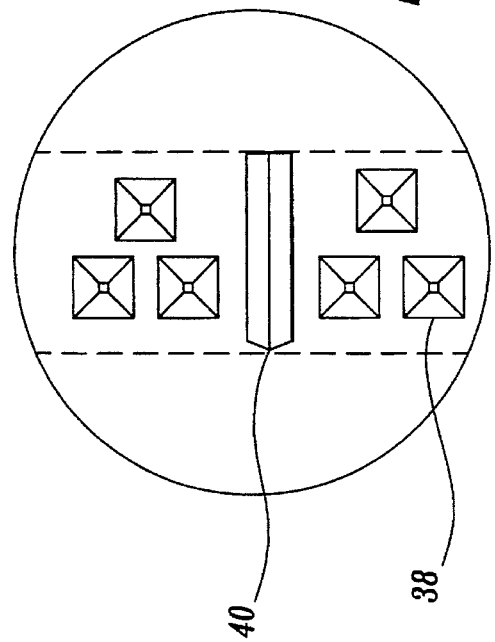
FIG. 5 shows a schematic depiction of a silicon wafer where the central portion of the silicon wafer has been removed (etched) in order to accommodate the active region of a corresponding multichip module if a 3-D stacking approach is adopted. This part can be used as a spacer between multichip modules; the spacer is provided with V-grooves that allow coolant to flow between pairs of spacers in order to cool the active area of a multichip module located in the cavity created by the pair of spacers.
Figure 5A:
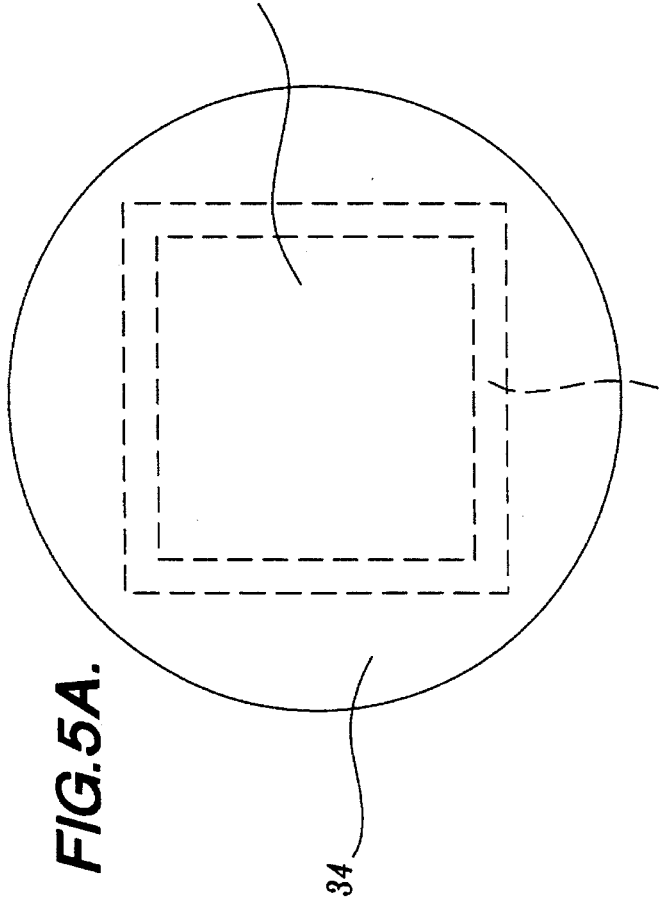

In another preferred embodiment of the present invention, the silicon wafers containing feedthroughs may be provided with grooves which form channels when they are stacked. The channels allow the stacked structure to be cooled by coolant material present in the channels. As shown in FIG. 5, the silicon wafer (34) contains a region (36) defined by the dotted lines in FIG. 5 in which the feedthroughs (38) are located. In addition to having feedthroughs located in this region, this region also contains V-grooves (40) that are preferably approximately perpendicular to the feedthrough axis, as shown in the magnified region of FIG. 5.

Figure 6:
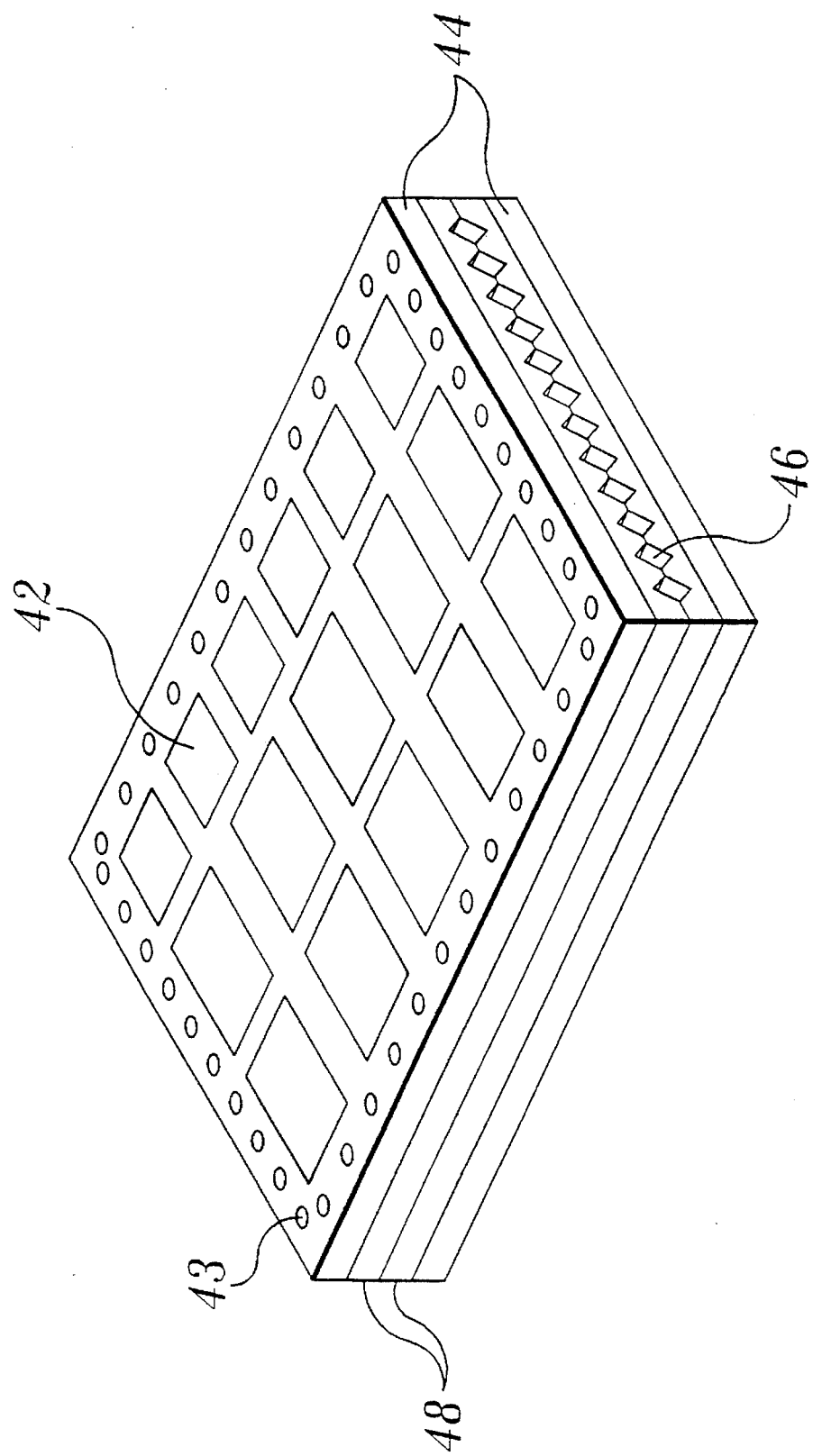
FIG. 6 shows a stacked multichip module with spacers in between populated multichip modules.
Figure 7:
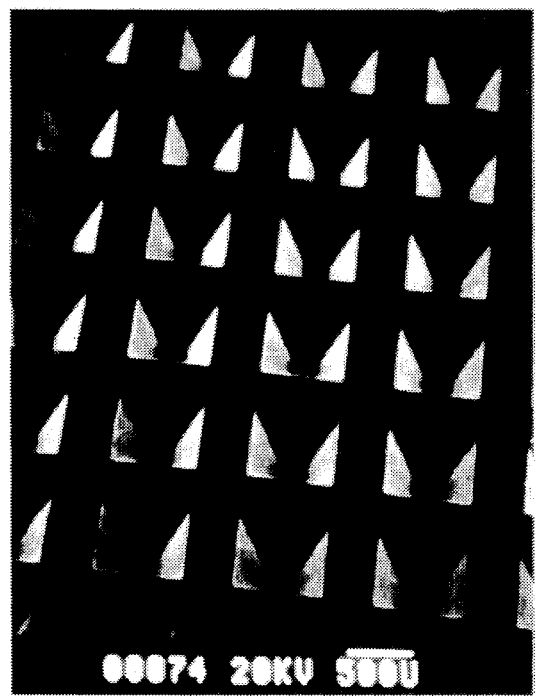
FIG. 7 shows a top view of an electron micrograph of an array of etched feedthrough holes in a silicon wafer.
Figure 8:
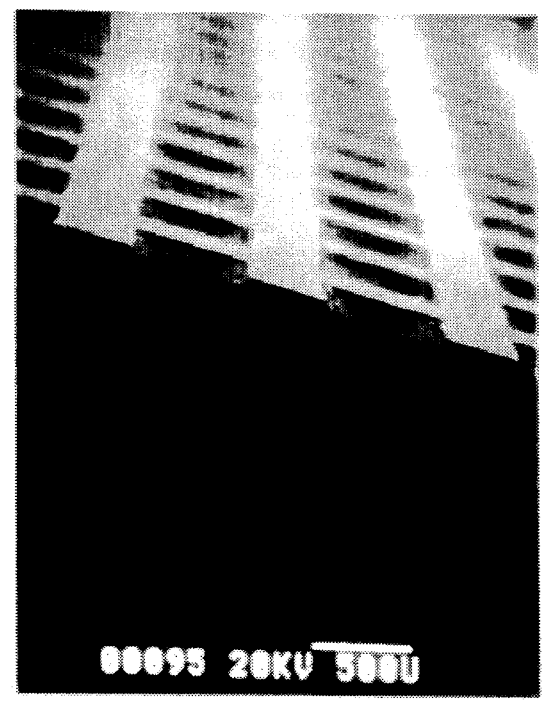
FIG. 8 shows a cross-sectional electron micrograph of an array of etched feedthrough holes in a silicon wafer and filled with copper metal.

The silicon wafer shown in FIG. 5 may serve as a spacer between separate multichip modules, as shown in FIG. 6. In other words, rather than having the multichip active area (26) located on the center of the silicon wafer (22) as shown in FIG. 3, in the embodiment shown in FIG. 5 the central area corresponding to the multichip module region (35) is etched out at the same time that the feedthroughs are made. After the periphery of the wafer (34) is sawed off, the freestanding section of the silicon wafer in the shape of the dotted lines is left. This structure is referred to herein as a spacer. In FIG. 6, two integrated circuit (42)—populated multichip modules (44) are stacked above and below two silicon wafer sections (48) containing feedthroughs (43) and V-grooves (46). When two spacers are placed back-to-back so that the feedthroughs and V-grooves are aligned on the two spacers, a spacer structure as shown in FIG. 6 results. In this spacer arrangement, the V-grooves form channels (46) in which a coolant can be circulated so that the integrated circuits can be cooled down to operating conditions.

The central area (35) should be etched out because in general the thickness of the integrated circuits is of the same magnitude as the thickness of the multichip module substrates and spacers. Also, this will be desirable because the larger the size of the cavity, the more efficient the cooling. Without cooling, the devices will probably overheat and stop operating in this configuration.

Alternate configurations are also contemplated in connection with this invention. The first method uses the feedthroughs to bond the multichip module electrically and mechanically to a pin-grid-type substrate where electrical pins come out of it. The second configuration involves connecting the multichip module to a circuit board similar to the chip-on-board-type concept. A third configuration involves connecting two multichip modules back-to-back so that both surfaces are open for cooling purposes. (In this last case, one can envision the multichip module composite being connected only at the periphery.)

While the present invention has been described in conjunction with preferred embodiments, one of ordinary skill after reading the foregoing specification will be able to effect various changes, substitutions of equivalents, and alterations of the subject matter set forth herein. It is therefore intended that the protection granted by Letters Patent hereon be limited only by the definitions contained in the appended claims and equivalents thereof.

The embodiments of the invention in which an exclusive property or privilege is claimed are defined as follows:

1. A multichip module, comprising:

first and second silicon wafers, each of said silicon wafers having feedthroughs in at least a portion of the periphery thereof, said feedthroughs being electrically connected to circuitry located on a central portion of each of said silicon wafers, and first and second silicon wafer spacers, each of said silicon wafer spacers comprising feedthroughs in at least a portion of the periphery thereof, a central space sized to accommodate circuitry, and grooves radiating from said central space to the outer surface of each of said silicon wafer spacers, said silicon wafer spacers being in face to face contact such that corresponding feedthroughs are aligned in electrical or thermal contact, and said grooves are aligned to form channels between said silicon wafer spacers, with a coolant circulated in the channels between the silicon wafer spacers to cool the multichip module;

said silicon wafer spacers being sandwiched between said first and second silicon wafers such that the feedthroughs in each of said silicon wafers are in electrical or thermal contract with corresponding feedthroughs in said silicon wafer spacers.

2. A silicon wafer having a first surface and a second surface opposite the first surface comprising a feedthrough in the shape of an hourglass extending along a feedthrough axis between the first surface and the second surface and grooves formed in the first surface generally perpendicular to the feedthrough axis.

3. The silicon wafer of claim 2 a feedthrough in the shape of an hourglass extending along a feedthrough axis between the first surface and the second surface, wherein the feedthrough is coated with a dielectric material electrically isolating the feedthrough from the wafer.

4. The silicon wafer of claim 3 wherein the feedthrough is filled with metal.

5. The silicon wafer of claim 3, further comprising integrated circuitry in a central area, the feedthrough being electrically connected to said circuitry by a conductive line.

6. The silicon wafer of claim 3, wherein the periphery of said wafer is rectilinear.

7. The silicon wafer of claim 3, further comprising grooves in the first surface radiating from a central area to the periphery of said wafer.

8. A multichip module, comprising:

first and second silicon wafers, each of said silicon wafers having feedthroughs in at least a portion of the periphery thereof, said feedthroughs being electrically connected to circuitry located on a central portion of each of said silicon wafers;

first and second silicon wafer spacers, each of said silicon wafer spacers comprising feedthroughs in at least a portion of the periphery thereof, a central space sized to accommodate circuitry, and grooves radiating from said central space to the outer surface of each of said silicon wafer spacers, wherein said feedthroughs extend through said silicon wafers along a feedthrough axis, said grooves radiating from said central space in a direction generally perpendicular to the feedthrough axis;

said silicon wafer spacers being in face-to-face contact such that corresponding feedthroughs are aligned in electrical or thermal contact, and said grooves are aligned to form channels between said silicon wafer spacers; and said silicon wafer spacers being sandwiched between said first and second silicon wafers such that the feedthroughs in each of said silicon wafers are in electrical or thermal contact with corresponding feedthroughs in said silicon wafer spacers.

9. The multichip module of claim 1, wherein said silicon wafer spacers include a central space which has been removed leaving an opening through the center of said silicon wafer spacers.

10. The silicon wafer of claim 3, further comprising:

(a) a core formed of an electrically conductive material, extending through the feedthrough;

(b) an insulating layer formed of a dielectric material coating the core to electrically insulate the core from the wafer; and (c) a conducting layer formed of an electrically conductive material positioned between the insulating layer and the wafer.

* * * * *